United States Patent [19]

Okamura et al.

[11] Patent Number: 5,351,020
[45] Date of Patent: Sep. 27, 1994

[54] BAND-PASS FILTER HAVING THREE OR MORE LOOP-SHAPED ELECTRODES

[75] Inventors: Hisatake Okamura; Masahiro Kasahara; Ken Tonegawa; Tetsuo Taniguchi, all of Nagaokakyo, Japan

[73] Assignee: Myrata Manufacturing Co., Ltd., Japan

[21] Appl. No.: 112,629

[22] Filed: Aug. 26, 1993

Related U.S. Application Data

[63] Continuation of Ser. No. 832,786, Feb. 7, 1992, abandoned.

[30] Foreign Application Priority Data

Feb. 15, 1991 [JP] Japan ................... 3-021875
Jun. 11, 1991 [JP] Japan ................... 3-138839
Jan. 10, 1992 [JP] Japan ................... 4-021749
Jan. 10, 1992 [JP] Japan ................... 4-021750

[51] Int. Cl.$^5$ ............................... H03H 7/09
[52] U.S. Cl. ........................ 333/175; 333/184; 333/185
[58] Field of Search ............ 333/167, 174–177, 333/178, 184, 185, 219, 204

[56] References Cited

U.S. PATENT DOCUMENTS 4,894,629  1/1990  Okamura et al. ............ 333/185 X
5,075,650 12/1991  Okamura et al. ............ 333/177

Primary Examiner—Seungsook Ham
Attorney, Agent, or Firm—Ostrolenk, Faber, Gerb & Soffen

[57] ABSTRACT

Three coil electrode patterns are formed on one surface of a plate containing of a dielectric material. These coil electrode patterns are formed in loop shape, and are disposed in a magnetically connecting state with respect to each other. An input/output terminal pattern and an earth terminal pattern are drawn out from each of the two coil electrode patterns which are disposed toward the end portions of the plate. The input/output terminal pattern and the earth terminal pattern are disposed at a distance for each other so as to provide a predetermined impedance. An earth electrode pattern is drawn out from the center coil electrode pattern. An earth electrode pattern is formed opposite the coil electrode patterns with the plate between them. Earth terminal patterns are formed to the earth electrode pattern. The earth terminal patterns of the earth electrode pattern are connected to the earth terminal patterns of the coil electrode patterns. A trimming electrode may be formed for adjusting the passing band frequency of the band-pass filter optionally.

11 Claims, 19 Drawing Sheets

F I G. 1
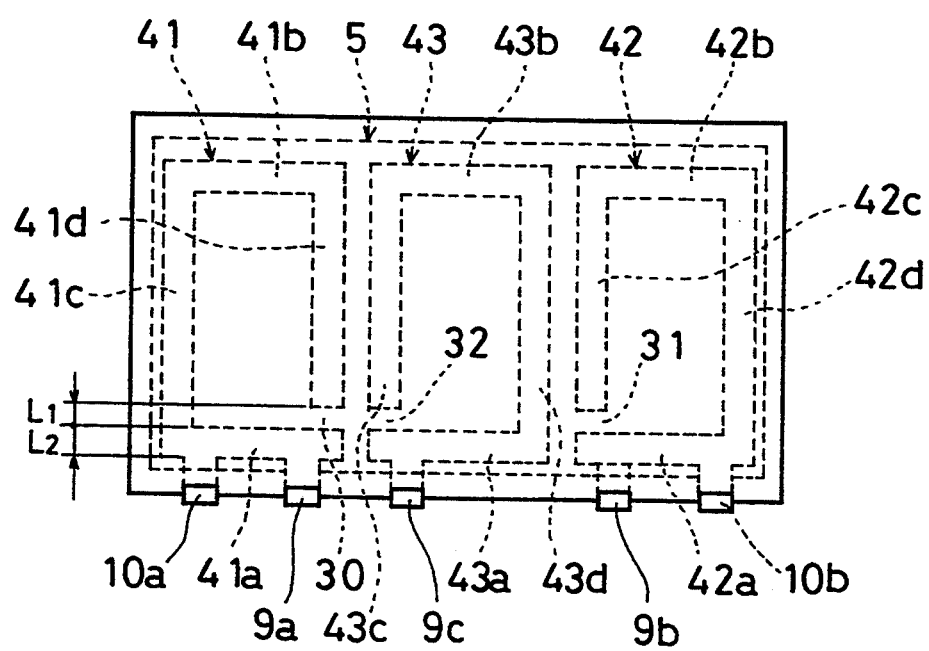

F I G.11
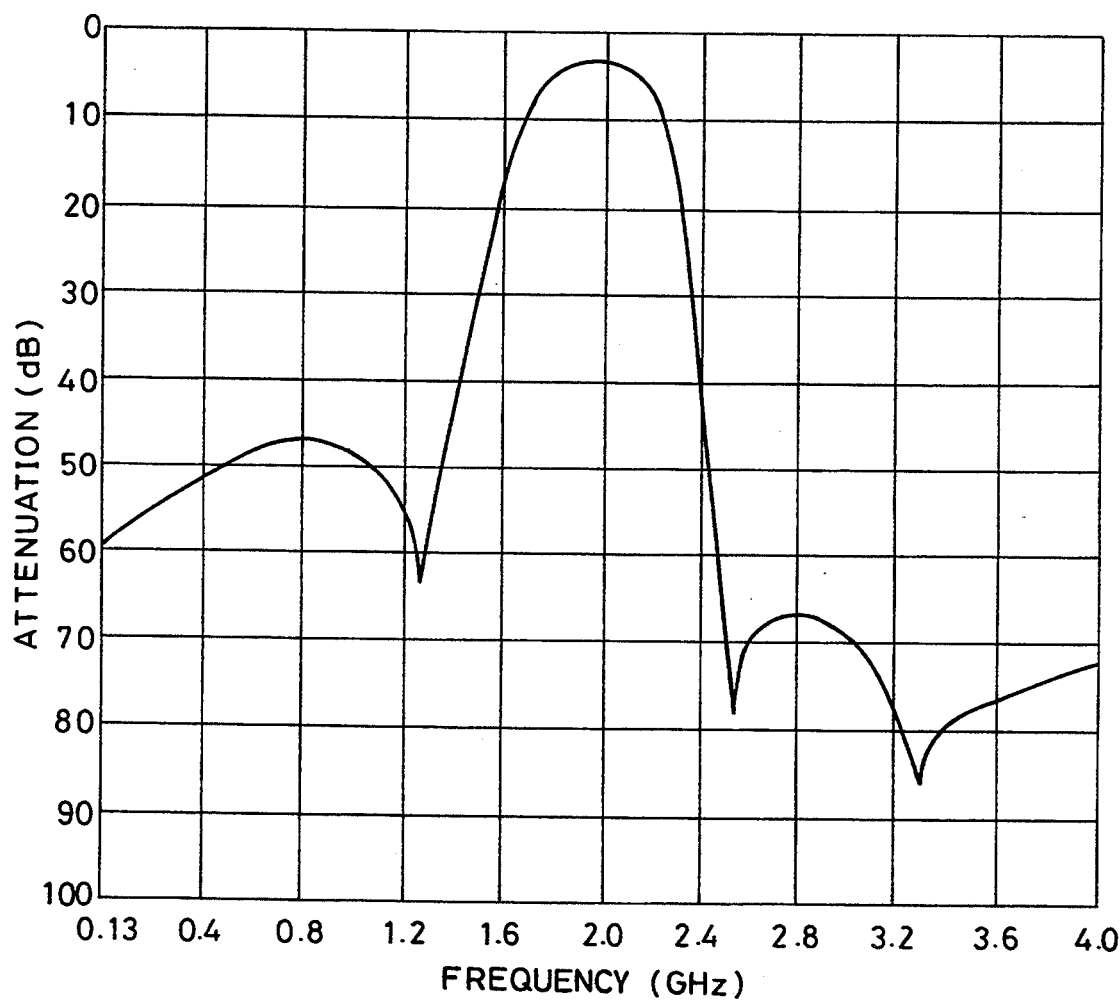

F I G. 12
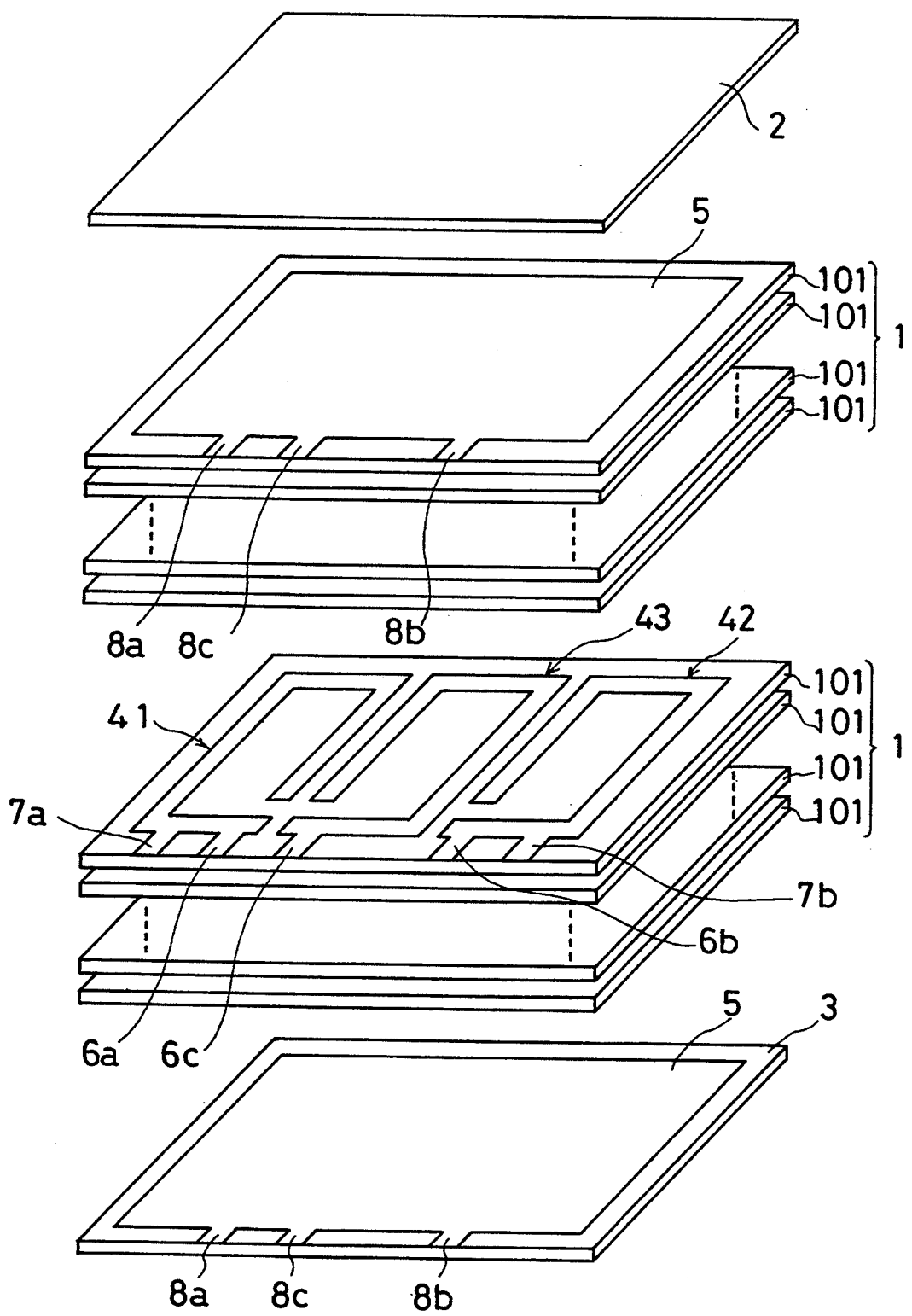

F I G. 16
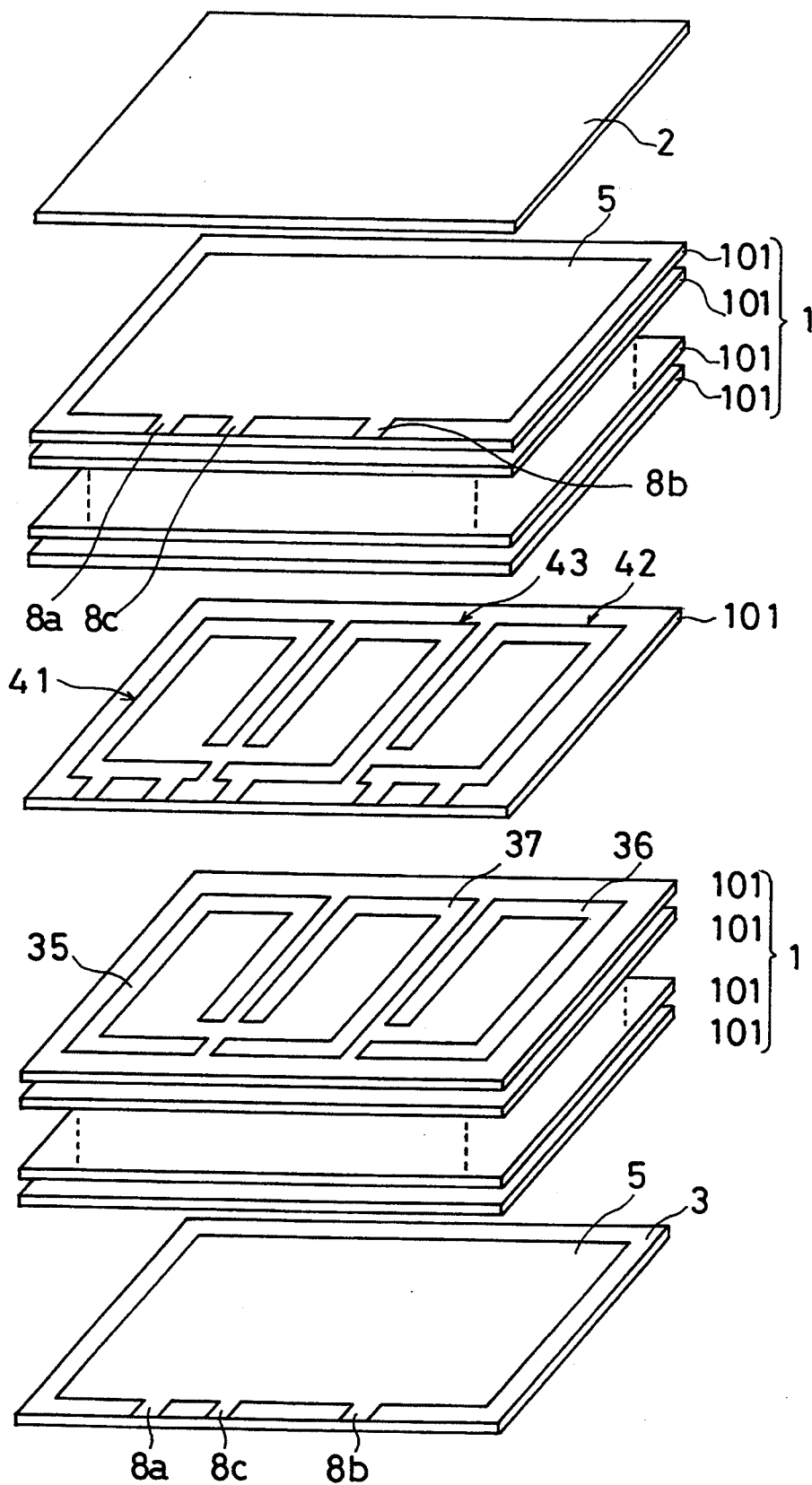

F I G. 17
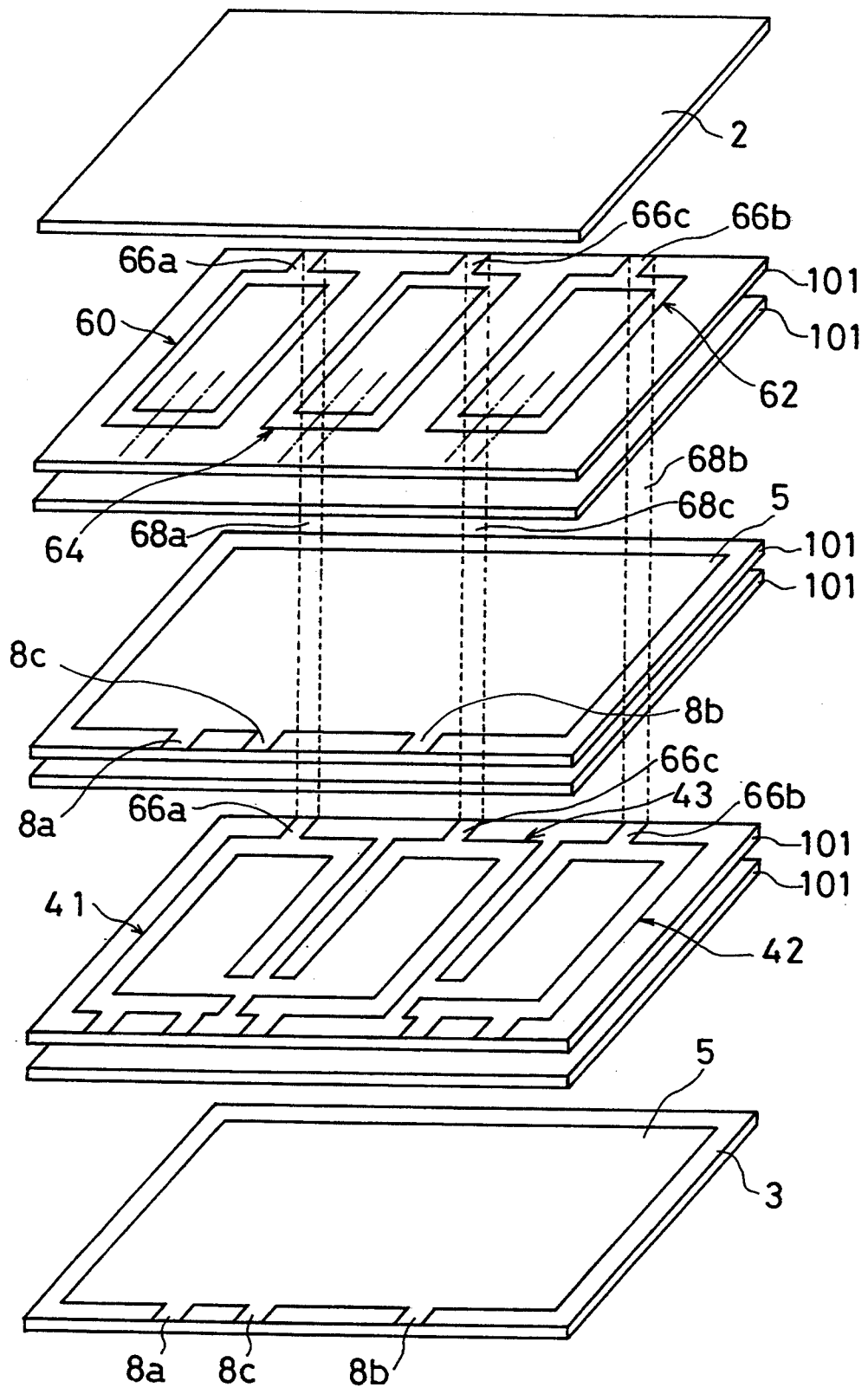

BAND-PASS FILTER HAVING THREE OR MORE LOOP-SHAPED ELECTRODES

This is a continuation of application Ser. No. 07/832,786 filed on Feb. 7, 1992 (abandoned).

BACKGROUND OF THE INVENTION

1. Field of the Invention

The present invention relates to a dielectric-laminate type band-pass filter for use in a portable radio and the like at the frequency of several hundred MHz to several GHz.

2. Description of the Prior Art

Conventional resonators may be divided roughly into the resonator using a strip line and the resonator using a coil pattern. When producing a band-pass filter by using such resonators, the band-pass filter is so constructed that plural resonators are connected magnetically.

Here, as the resonator using the strip line, there is a resonator of ½ wavelength whose line is open at both ends as shown in FIG. 23, and a resonator of ¼ wavelength whose line is open at one end and short-circuited at the other end as shown in FIG. 24.

Meanwhile, as the resonator using the coil pattern, as shown in FIG. 25, there is the one in which a spiral-shaped coil pattern 201 and an earth pattern 203 are formed on both sides of a dielectric layer 202 which is clamped therebetween.

In the band-pass filter using the above-mentioned conventional resonators, however, such problems as shown hereinafter were encountered respectively.

1 Band-Pass Filter Using The Strip Line (a) A resonator having the resonance frequency of 2 to 3 GHz becomes substantially large. In particular, if the band-pass filter has a construction in which plural resonators are connected, it becomes considerably large. This is due to the following reasons.

That is, lengths $L_{10}$, $L_{11}$ of the strip line are determined as shown in Equation 1 (resonator of ½ wavelength) and Equation 2 (resonator of ¼ wavelength).

$$L_{10} = \frac{1}{2} \lambda \times \frac{1}{\sqrt{\epsilon}} \quad \text{Equation 1}$$

$$L_{11} = \frac{1}{4} \lambda \times \frac{1}{\sqrt{\epsilon}} \quad \text{Equation 2}$$

Where, $\lambda$; wavelength, $\epsilon$; dielectric constant of dielectric-laminate sheet.

Hereupon, at present, a dielectric constant of a dielectric-laminate sheet which is capable of being co-fired with silver or copper and has a good temperature characteristic can not be made so large, about $\epsilon \approx 10$. Thus, in the above Equations 1 and 2, when $\epsilon = 10$, $L_{10} = 15.8$ mm and $L_{11} = 7.9$ mm, which are very long, thus resulting in a large resonator (band-pass filter) as stated above.

(b) In the band-pass filter, it is desirable to adjust input/output impedances depending on the apparatus into which it is incorporated (to adjust the matching of the impedances of the band-pass filter and the apparatus). However, in case of the strip-line type, since input/output impedances have specific values for every strip line, it is impossible to adjust the matching even when the take-out position from the strip line is changed.

2 Band-Pass Filter Using The Coil-Pattern

Since the coil pattern has a spiral shape, magnetic fluxes interact and influences one another between the adjoining patterns, thus an electric current flow is difficult to obtain. Therefore, a substantial resistance increases and Q becomes lower.

For example, in FIG. 25, since the electric current flows in a same direction (both in the direction D in FIG. 25) in a pattern piece 201a and a pattern piece 201b, the corresponding magnetic fields cancel each other and cause the magnetic flux to become coarse, and consequently, electric current flow is disturbed and the substantial resistance increases.

A further problem is that an insertion loss of the band-pass filter becomes larger when Q is reduced.

The passing band frequency of the band-pass filter depends on the resonance frequencies of the resonators. The resonance frequencies of the resonators are decided by the dimensions of strip lines or coil-patterns, so once these patterns are formed, the resonance frequencies can not be adjusted. Therefore, when the dimensions of the patterns are in error, the passing band frequency of the band-pass filter is shifted from a predetermined desired value, resulting in an inferior device.

SUMMARY OF THE INVENTION

The present invention has been devised in view of such present circumstances, and herefore, it is an object thereof to provide a band-pass filter which has a high Q and a low insertion loss, and moreover, wherein the filter size can be minimized, and wherein the input/output impedances and the center frequency of the pass band can be adjusted optionally.

The present invention is directed to a band-pass filter comprising, three or more first electrodes formed in a loop shape and disposed in a magnetically connecting state with each other; a second electrode formed in a plane shape opposite the first electrodes with a plate consisting of a dielectric material between the first electrodes and the second electrode; an earth terminal drawn out from each of the first electrodes toward an end portion of the plate; an input/output a take-out terminal drawn out from the first and last of the first electrodes toward the end portion of the plate, at a distance from the earth terminal so as to provide a predetermined impedance; and another earth terminal drawn out from the second electrode toward the end portion of the plate.

In regard to the band-pass filter, the two second electrodes may be formed on the both sides of the first electrodes with dielectric plates between the first electrodes and the second electrodes.

In regard to the band-pass filter, at least one of the second electrodes may be divided into three or more and have a somewhat larger size than the first electrodes but similar in shape, and the other earth terminals are drawn out respectively from the electrodes which are divided into three or more toward an end portion of the plates.

In regard to the band-pass filter, between the first electrodes and at least one of the second electrodes, third electrodes having a same shape as the first electrodes may be formed.

In regard to the band-pass filter, trimming electrodes in a loop shape or a part of loop shape may be formed at a distance from the second electrode opposite the second electrode with the plate between the trimming electrodes and the second electrode, and are connected to the first electrodes.

In regard to the band-pass filter, plural trimming electrodes may be formed in a strip shape at an inner part of the second electrode, and connected to the second electrode.

When it is constructed as stated above, because it is a so-called strip-line construction in which the first electrodes and the second electrodes are positioned on opposite sides, and because pattern pieces of the first electrodes are not adjacent to each other as in the conventional spiral-shaped coil pattern, Q is improved remarkably and an insertion loss is reduced, improving skirting characteristics.

Moreover, since the first electrodes have a loop shape, the element size becomes smaller. In addition, since the impedance can be adjusted by just changing a distance between the input/output terminal and the earth terminal of the first electrodes, it is very simple to adjust the impedance.

The floating capacitance between the trimming electrodes and the second electrode is changed by trimming the trimming electrodes which are connected to the first electrodes, and the resonance frequency of each resonator is also changed. The passing band frequency of the band-pass filter is changed with the advance of changing of resonance frequency.

The magnetic field shielding effect is changed by cutting the trimming electrodes formed at the inner part of the second electrode. Hence, the magnetic field of each resonators is changed, and the resonating frequency is thereby changed. And the passing band frequency of the band-pass filter is also changed.

In these respects, the invention has an effect of providing a very excellent small-sized band-pass filter whose insertion loss is small and input/output impedances and passing band frequency can be adjusted optionally.

The above and further objects, features and advantages of the present invention will be more fully apparent from the following detailed description of the embodiments with accompanying drawings.

BRIEF DESCRIPTION OF THE DRAWINGS

FIG. 1 is a plan view of a band-pass filter according to a first example of the present invention.

FIG. 11 is a graph showing frequency characteristics of the band pass filter shown in FIG. 1.

FIG. 12 is an exploded perspective view of a band-pass filter according to a second example of the present invention.

FIG. 16 is an exploded perspective view of a band-pass filter according to a fourth example of the present invention.

FIG. 17 is an exploded perspective view of a band-pass filter according to a fifth example of the present invention.

DESCRIPTION OF THE PREFERRED EMBODIMENTS

First Example

Figure 2:
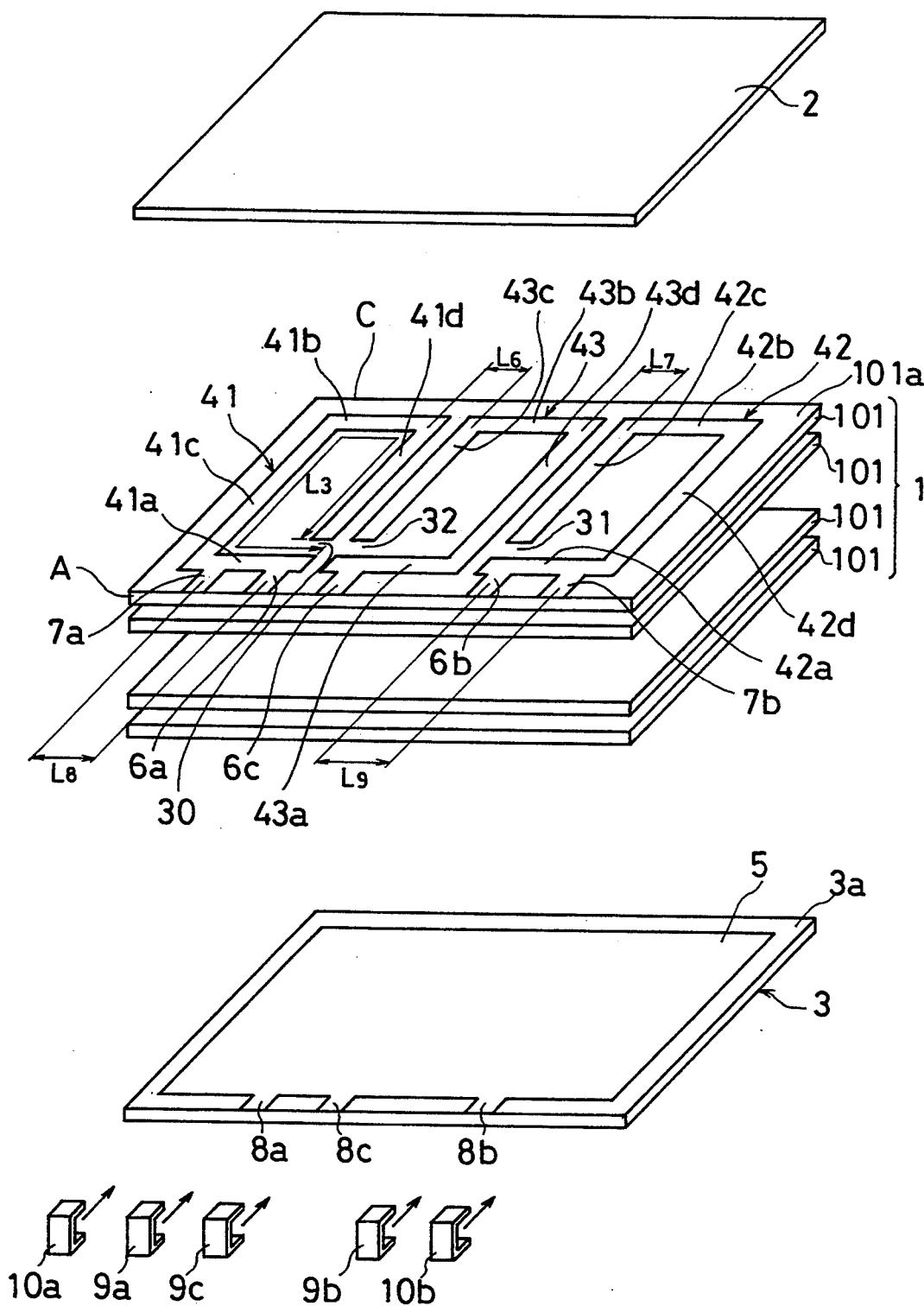
FIG. 2 is an exploded perspective view of the band-pass filter according to the first example of the present invention.
Figure 3:
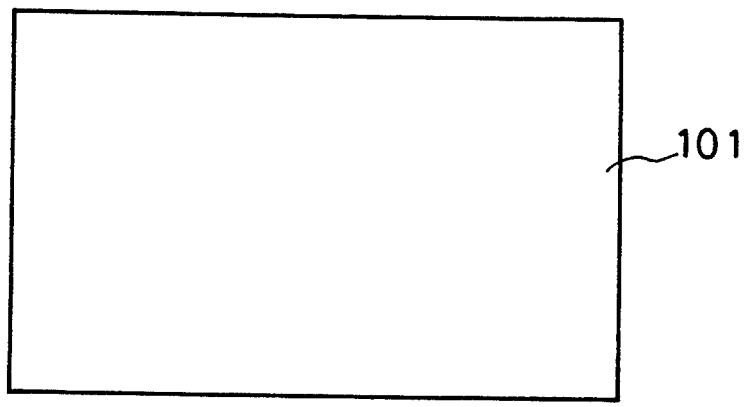
FIG. 3 is a plan view of a dielectric sheet used in the present invention.
Figure 4:
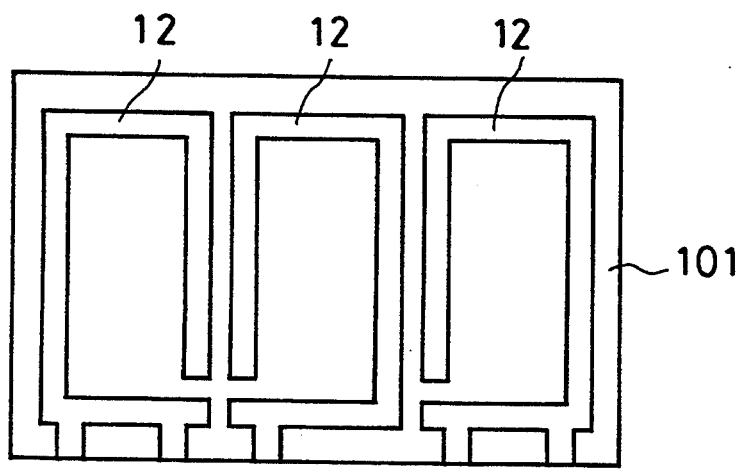
FIG. 4 is a plan view showing a state where coil electrode patterns are formed on the dielectric sheet of FIG. 3.
Figure 5:
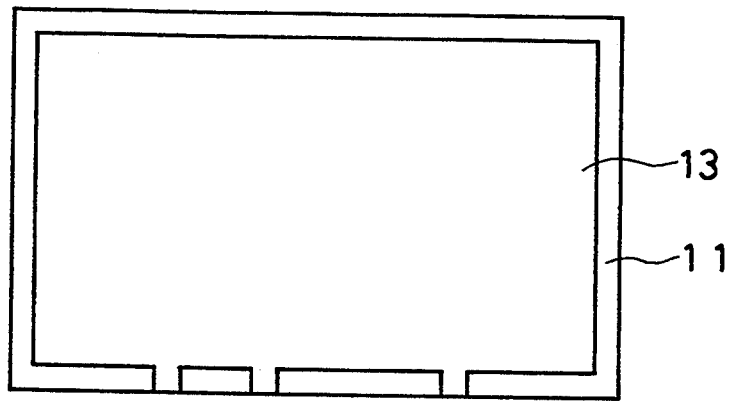
FIG. 5 is a plan view showing a state where an earth electrode pattern is formed on the dielectric sheet of FIG. 3.
Figure 6:
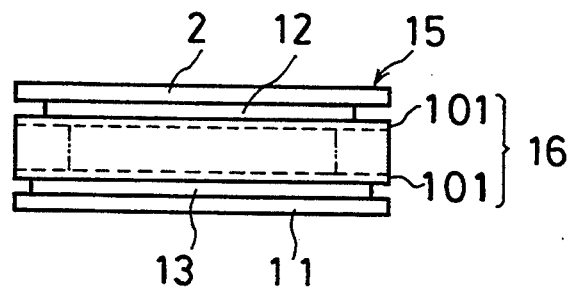
FIG. 6 is a side view when the dielectric sheets are laminated.
Figure 7:
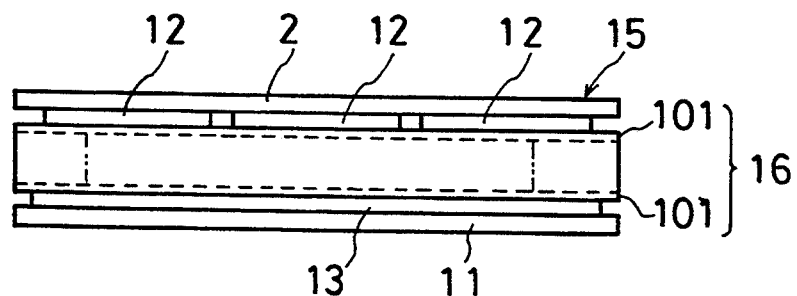
FIG. 7 is a front view when the dielectric sheets are laminated.
Figure 8:
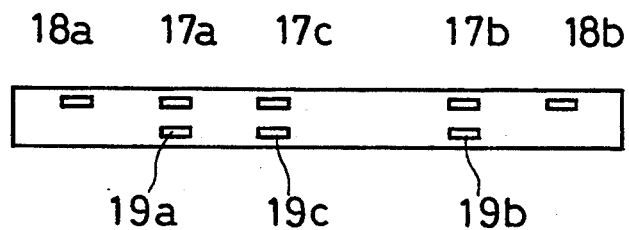
FIG. 8 is a front view when a laminate is pressed.
Figure 9:
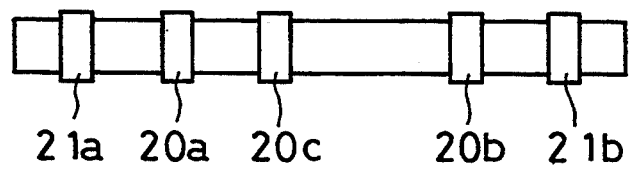
FIG. 9 is a front view when external electrodes are formed.
Figure 10:
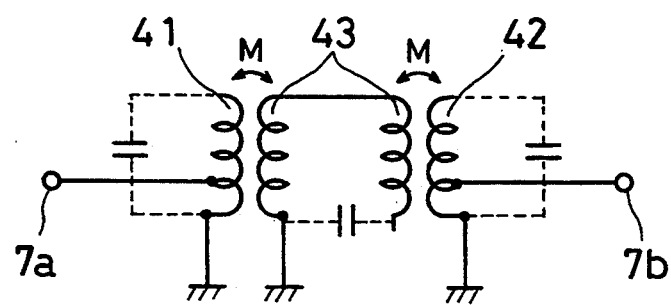
FIG. 10 is an equivalent circuit diagram of the band-pass filter shown in FIG. 1.

A first example of the present invention is described in the following with reference to FIG. 1 through FIG. 11. FIG. 1 and FIG. 2 are views showing a construction of a band-pass filter according to the first example of the present invention, wherein FIG. 1 is a plan view and FIG. 2 is an exploded perspective view, FIG. 3 is a plan view of a dielectric sheet used in the present invention, FIG. 4 is a plan view showing a state where coil electrode patterns are formed on the dielectric sheet of FIG. 3, FIG. 5 is a plan view showing a state where an earth electrode pattern is formed on the dielectric sheet of FIG. 3, FIG. 6 and FIG. 7 are views when the dielectric sheets are laminated, wherein FIG. 6 is a side view and FIG. 7 is a front view, FIG. 8 is a front view when a laminate is pressed, FIG. 9 is a front view when external electrodes are formed, FIG. 10 is an equivalent circuit diagram of the band-pass filter and FIG. 11 is a graph showing frequency characteristics of the band-pass filter.

As shown in FIG. 2, the band-pass filter of the present invention comprises, a dielectric layer 1 consisting of plural dielectric sheets 101 . . . and protective layers 2, 3 provided on upper and lower sides of the dielectric layer 1. On one surface 101a of the top dielectric sheet 101, three coil electrode patterns (first electrodes) 41, 42 and 43 are formed. These are fired and integrated with one another.

A specific construction of the coil electrode pattern 41 is such that, pattern pieces 41a and 41b which are linear and disposed on the opposite sides are connected via a linear pattern piece 41c which is connected to respective ends of the pattern pieces 41a, 41b, and on the other end of the pattern piece 41b, a pattern piece 41d is formed which is extended toward the pattern piece 41a so as to be parallel to the pattern piece 41c.

Here, it is so constructed that a total length $L_3$ of the coil electrode pattern 41 becomes the length shown in Equation 3.

$$L_3 = \frac{1}{4} \lambda \times \frac{1}{\sqrt{\epsilon}}$$ Equation 3

Where, $\lambda$; wavelength, $\epsilon$; dielectric constant.

It is desirable that a distance $L_1$ between the pattern piece 41d and the pattern piece 41a ( refer to FIG. 1 ) is equal to or less than a width $L_2$ of the pattern piece 41a the width pattern piece 41b, pattern piece 41c, and pattern piece 41d is also the same as the width $L_2$). In the following examples, a distance between the pattern pieces 41a and 41d is called a gap 30.

The coil electrode patterns 42, 43 have substantially the same shape as the coil electrode pattern 41 having the aforesaid construction. However, they are different in point that, gaps 31, 32 (constructed with the same length as the gap 30) are formed respectively between the pattern pieces 42a and 42c and between the pattern pieces 43a and 43c.

The pattern pieces 41d, 43c of the coil electrode patterns 41, 43 and the pattern pieces 42c, 43d of the coil electrode patterns 42, 43 are disposed in an adjoining fashion with each other, and are respectively connected magnetically.

To the coil electrode patterns 41, 42, earth terminal patterns 6a and 6b and input/output terminal patterns 7a and 7b are connected respectively, and end portions of the earth terminal patterns 6a, 6b and the take-out terminal patterns 7a, 7b are extended to a side face A of the band-pass filter. To the coil electrode pattern 43, an earth terminal pattern 6c is connected, and an end portion of the earth terminal pattern 6c is extended to the side face A of the band-pass filter.

Next, an earth electrode pattern (second electrode) 5 is formed on a face 3a of the protective layer 3 on the side of the dielectric layer 1, and is constituted substantially throughout the face 3a such that the size of the earth electrode pattern 5 becomes larger than a periphery of the coil electrode patterns 41, 42 and 43. Also, at positions on the face 3a corresponding to the earth terminal patterns 6a, 6b and 6c, earth terminal patterns (other earth terminals) 8a, 8b and 8c whose one ends are connected to the earth electrode pattern 5 and whose other ends are extended to the side face A of the band-pass filter are formed. And, the earth terminal pattern 6a and the earth terminal pattern 8a are connected to an external earth electrode 9a, the earth terminal pattern 6b and the earth terminal pattern 8b are connected to an external earth electrode 9b and the earth terminal pattern 6c and the earth terminal pattern 8c are connected to an external earth electrode 9c. The input/output terminal pattern 7a is connected to an external input-/output electrode 10a and the input/output terminal pattern 7b is connected to an external input/output electrode 10b. The external earth electrodes 9a, 9b, 9c and the external input/output electrodes 10a, 10b are formed on the side face of the band-pass filter to show a U-shaped cross section.

Hereupon, the band-pass filter having the above-mentioned construction was produced by the following procedures.

First, on one surface of a dielectric sheet 101 (about several tens μm thick) shown in FIG. 3, a copper paste or the like is coated to form patterns (the same patterns as the coil electrode patterns 41, 42, 43 and the terminal patterns 6a, 6b, 6c, 7a, 7b) 12 as shown in FIG. 4. While, in parallel thereto, on one surface of a protective sheet 11 having a same configuration as the dielectric sheet 101 (however, a thickness may be different), the copper paste or the like is coated to form a pattern (same pattern as the earth electrode pattern 5 and the earth terminal patterns 8a, 8b, 8c) 13 as shown in FIG. 5.

Next, as shown in FIG. 6 and FIG. 7, a protective sheet 2, a sheet layer 16 and the protective sheet 11 (a same construction as the protective sheet 2) are laminated such that the pattern 12 and the pattern 13 are disposed on the opposite sides via the sheet layer 16 consisting of the dielectric sheets 101, and further are pressed to produce a laminate 15. Hereinafter, at locations (the locations which serve as the external earth electrodes 9a, 9b, 9c and the external input/output electrodes 10a, 10b) corresponding to exposed portions 17a, 17b, 17c, 18a, 18b, 19a, 19b, 19c of paste layers shown in FIG. 8, the copper paste or the like is printed or coated to produce paste layers 20a, 20b, 20c, 21a, and 21b as shown in FIG. 9. Then, the dielectric sheets are integrated by firing the laminate, thereby the band-pass filter is produced. Here, the laminate may be fired by a process separate from firing the paste layers 20a, 20b, 20c, 21a and 21b.

Now, though no capacitor pattern is formed on the band-pass filter which is produced in the above-mentioned manner, it has an equivalent circuit as shown in FIG. 10 (in the figure, reference character M designates a magnetic connection). This is due to two reasons shown in the following.

(1) The coil electrode patterns 41, 42, 43 and the earth electrode pattern 5 are at the same potential (that is, in the earthed state).

(2) Since the dielectric layer 1 is interposed between the coil electrode patterns 41, 42, 43 and the earth electrode pattern 5, a floating capacitance is produced.

Since the capacitor formed in such a manner and between the pattern pieces 41d, 43c of the coil electrode patterns 41, 43 and the pattern pieces 42c, 43d of the coil electrode patterns 42, 43 are magnetically connected, it has the equivalent circuit as shown in FIG. 10.

Since the above-mentioned floating capacitance is mainly produced between the coil electrode patterns 41, 42, 43 and the earth electrode pattern 5, by bringing the coil electrode patterns 41, 42, 43 and the earth electrode pattern 5 close to or apart from one another, a capacitance of the capacitor changes and it is possible to change the frequency of the passing band. Specifically, when the coil electrode patterns 41, 42, 43 and the earth electrode pattern 5 are brought close one another (reducing the thickness of the dielectric sheets 101), since the capacitance of the capacitor increases, the passing band frequency becomes lower, while when the coil electrode patterns 41, 42, 43 and the earth electrode pattern 5 are brought apart from one another (increasing the thickness of the dielectric sheets 101), since the capacitance of the capacitor decreases, the passing band frequency becomes higher. The floating capacitance can also be changed by changing the dielectric constant of the dielectric layer 1 or the size of the coil electrode patterns 41, 42, 43. For example, when a width $L_2$ of the coil electrode patterns 41, 42, 43 is broadened, it can be minimized because the floating capacitance becomes larger and the passing band frequency can be lowered. However, when distances between the pattern pieces are too narrow, the waveform is deteriorated, so that it is not desirable to unnecessarily broaden the width $L_2$ of the coil electrode patterns 41, 42, 43.

Furthermore, a band width of the above-mentioned band-pass filter is changed by changing a distance $L_6$ between the pattern pieces 41d and 43c or a distance $L_7$ between the pattern pieces 42c and 43d. Specifically, when the distance $L_6$ or $L_7$ is narrowed, the band width becomes wider, while when the distance $L_6$ or $L_7$ is broadened, the band width becomes narrower. However, it is not desirable to unnecessarily narrow the distance $L_6$ or $L_7$ as it shows a double-humped characteristic.

Input/output impedances are changed by changing a distance $L_8$ between the earth terminal pattern 6a and the input/output terminal pattern 7a, or a distance $L_9$ between the earth terminal pattern 6b and the input/output terminal pattern 7b.

According to the experiment, by adjusting a dielectric constant or thickness of the dielectric layer 1 or an area of the coil electrode pattern 4, applicable frequencies of the band-pass filter of the present invention could be brought to a range of several hundred MHz to several GHz. An example thereof is shown in the following experiment.

Experiment

Frequency characteristics of the band-pass filter having the above-mentioned construction were examined, and the result is shown in FIG. 11.

Other Respects (1) In the case of installing the band-pass filter of the present invention, it may be installed and soldered while electrodes on a printed circuit board and the external earth electrodes 9a, 9b, 9c and the external input/output electrodes 10a, 10b are positioned one another. At this time, since outsides are covered with the protective layers 2, 3, the coil electrode patterns 41, 42, 43 and the earth electrode pattern 5 are protected from damages.

(2) As for the dielectric layer 1, it is not limited to the construction where several thin dielectric sheets 101 are laminated, but rather a single dielectric sheet which is formed with a predetermined thickness beforehand may be used.

(3) The band-pass filter of the present invention need not be produced one by one, but rather it may be produced such that plural coil electrode patterns 41, 42, 43 are formed on a broad dielectric sheet, and the same number of earth electrode patterns 5 are formed on the similar dielectric sheet, and after laminating in that state, cut apart one by one for firing.

Second Example

A second example of the present invention is described in the following with reference to FIG. 12 and FIG. 13. FIG. 12 is an exploded perspective view of a band-pass filter according to the second example of the present invention, and FIG. 13 is a graph showing frequency characteristics of the band-pass filter shown in FIG. 12.

As shown in FIG. 12, it has the same construction as the first example, except that a pair of dielectric layers 1 and corresponding earth electrode pattern 5 are disposed in order on both sides of the coil electrode patterns 41, 42, 43.

EXPERIMENT

Figure 13:
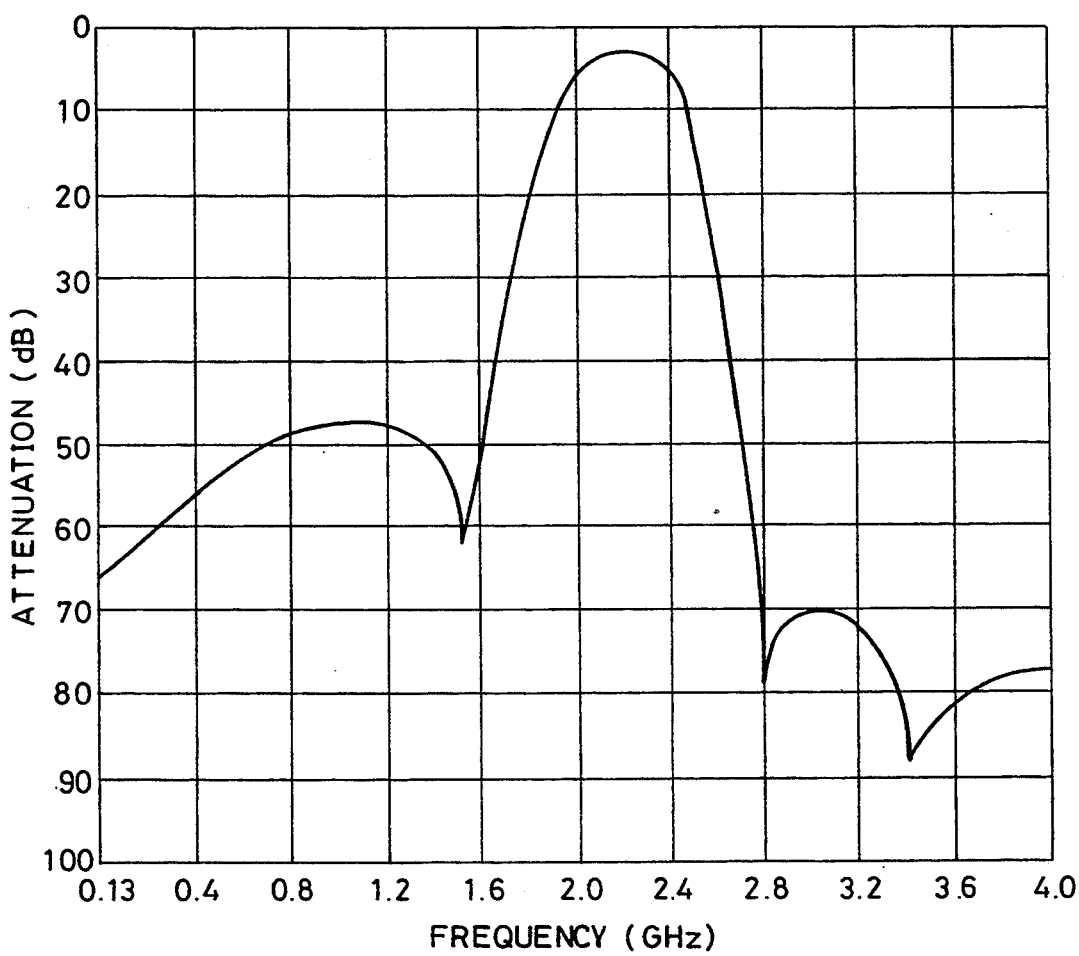
FIG. 13 is a graph showing frequency characteristics of the band-pass filter shown in FIG. 12.

Frequency characteristics of the band-pass filter having the above-mentioned construction were examined, and the result is shown in FIG. 13.

As is obvious from FIG. 13, it is reckoned that the passing band frequency is somewhat high.

This is believed to the be due to reason that a capacitance of a capacitor of the band-pass filter increases, because a floating capacitance is formed not only on one side but rather on both sides of the coil electrode patterns 41, 42, 43.

THIRD EXAMPLE

Figure 14:
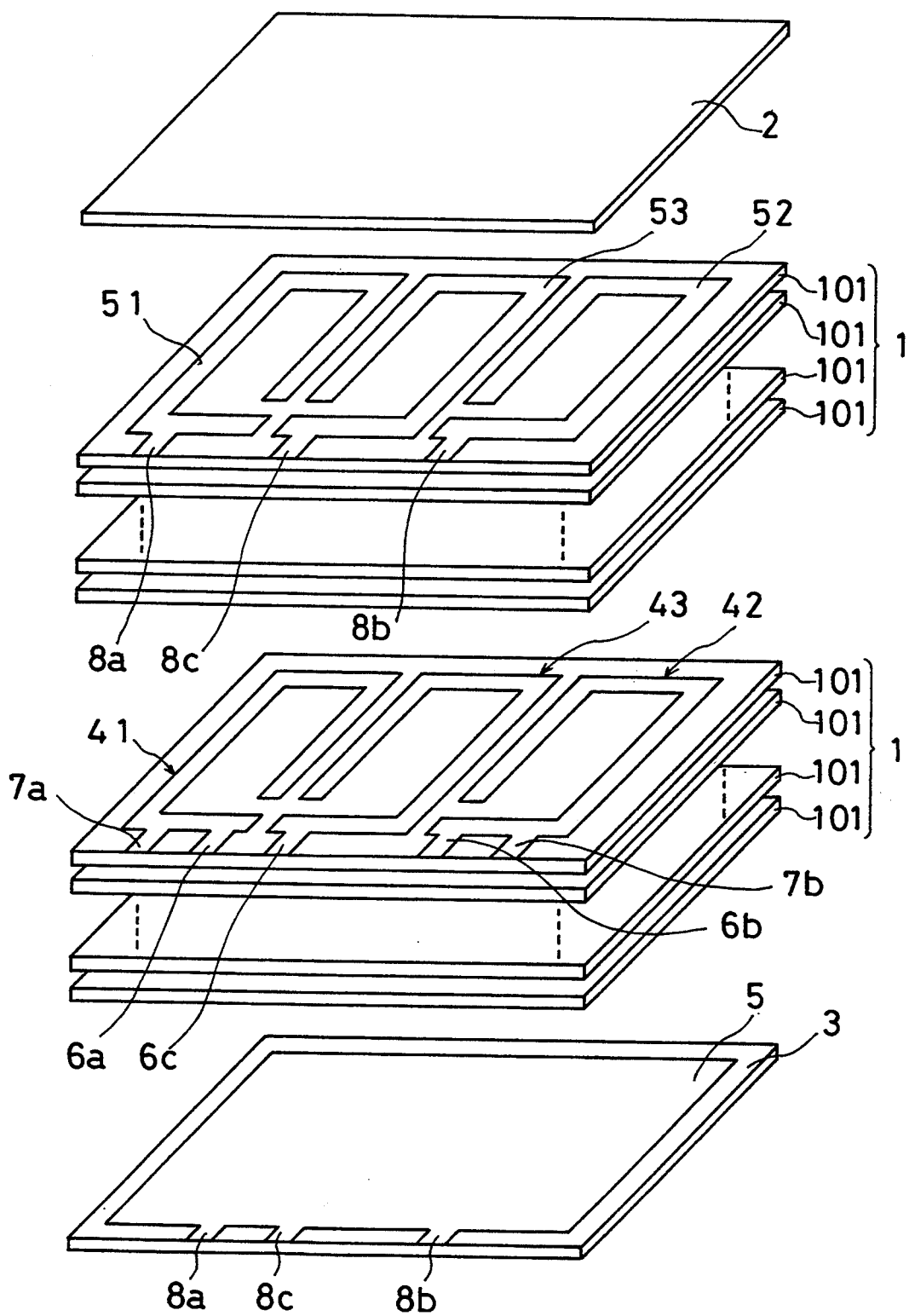
FIG. 14 is an exploded perspective view of a band-pass filter according to a third example of the present invention.
Figure 15:
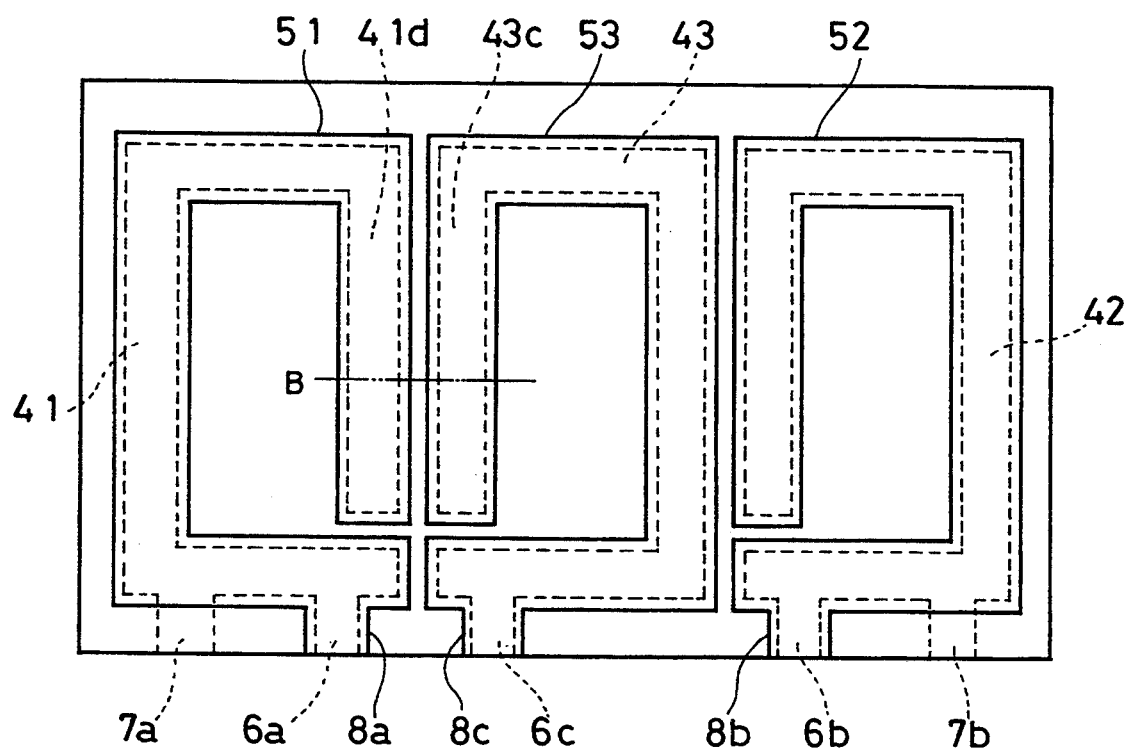
FIG. 15 is a plan view of essential portions of the band-pass filter according to the third example of the present invention.

A third example of the present invention is described in the following with reference to FIG. 14 and FIG. 15. FIG. 14 and FIG. 15 are views showing a band-pass filter according to the third example of the present invention, wherein FIG. 14 is an exploded perspective view and FIG. 15 is a plan view.

As shown in FIG. 14 and FIG. 15, it has the same configuration as the band-pass filter shown in the abovementioned second example, except that a shape of one earth electrode pattern (the upper pattern in FIG. 14) is made different. Specifically, the earth electrode pattern is divided into three pattern. Respective earth electrode patterns 51, 52, 53 are formed with a size larger than the coil electrode patterns 41, 42, 43, but similarly shaped. The earth electrode patterns 51, 52, 53 have earth terminal patterns 8a, 8b, 8c which are connected respectively to the corresponding earth terminal patterns of the earth electrode pattern 5.

By such a configuration, it is possible to simply adjust the frequency, because the floating capacitance can be adjusted just by cutting a portion (e.g. the portion shown by two-dot chain line B in FIG. 15) of the earth electrode patterns 51, 53 corresponding to the pattern pieces 41d, 43c.

Though the above-mentioned adjustment is also possible for the earth patterns of the first and second examples (which are formed extensively), when the frequency is to be adjusted, the configuration of this example is preferable, because the cut length that would be required with the earth electrode patterns of the first and second examples is long.

FOURTH EXAMPLE

A fourth example of the present invention is described in the following with reference to FIG. 16. FIG. 16 is an exploded perspective view of a band-pass filter according to the fourth example of the present invention.

As shown in FIG. 16, it has the same configuration as the band-pass filter shown in the second example, except that floating electrode patterns (third electrodes) 35, 36, 37 having a same shape as the coil electrode patterns 41, 42, 43 are formed on the dielectric sheet 101 adjacent to the dielectric sheet 101 whereon the coil electrode patterns 41, 42, 43 are formed.

Although not shown, it has been confirmed by experiment that, by such a configuration the center frequency of the passing band becomes much lower than the bandpass filter shown in the second example.

This is believed to be due to increase in capacitance of the capacitor of the band-pass filter, because a floating capacitance is formed between the coil electrode patterns 41, 42, 43 and the floating electrode patterns 35, 36, 37.

Figure 26:
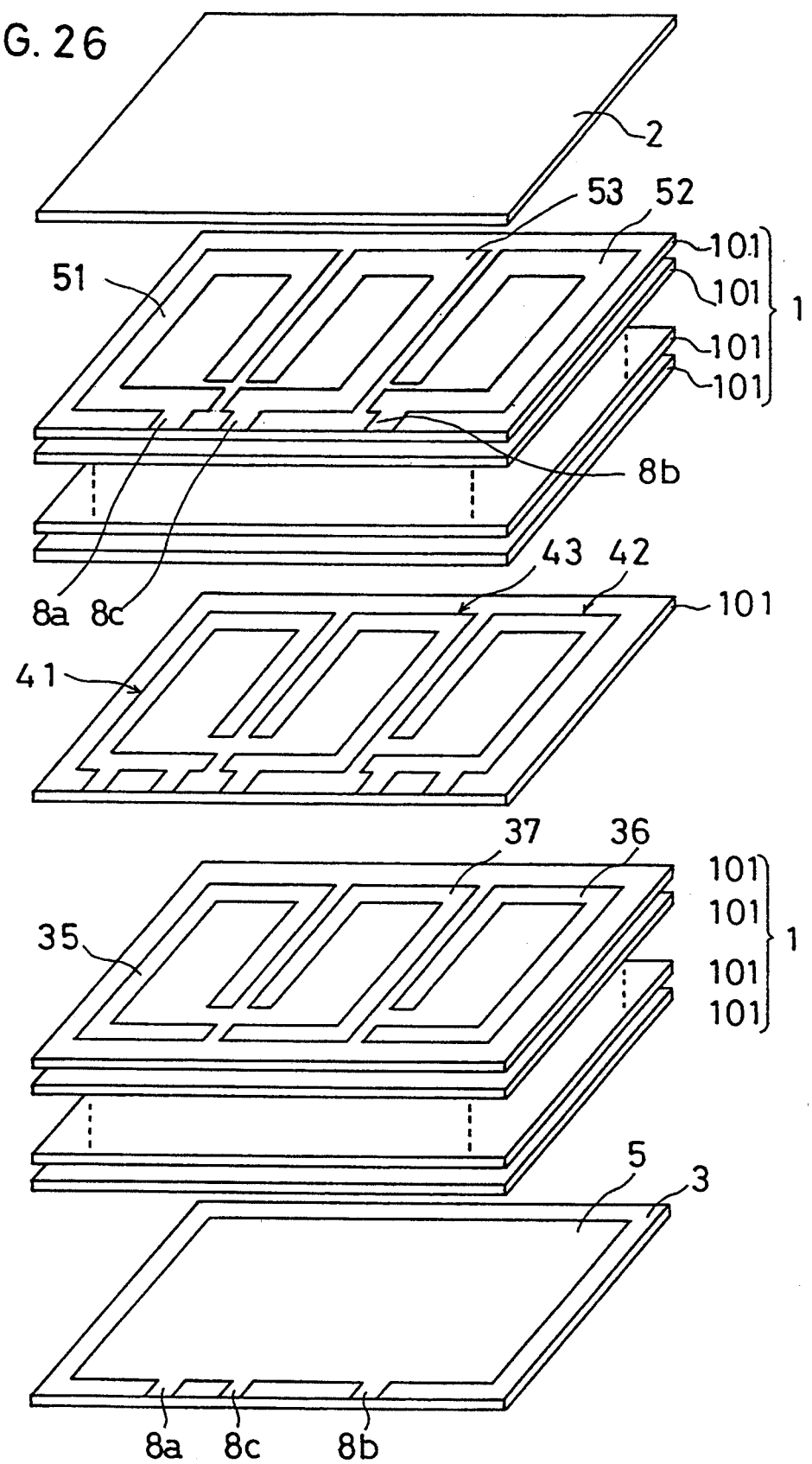
FIG. 26 is an exploded perspective view of a band-pass filter according to an additional embodiment of the invention.

FIG. 26 shows a modification of the fourth example of the invention. In this modified example, the earth electrode pattern (second electrode) 5 formed on the uppermost dielectric layer 1, as seen in FIG. 26, is formed into three sections 51, 53, 52. Each of the sections 51, 53, 52 has a shape similar to that of an adjacent first electrode 41, 43 or 42, but larger, in that the strip-shaped material of which the second electrode sections are formed has a greater width than the corresponding material strips of the first electrodes. Respective second earth terminals 8a, 8c, 8b are drawn out respectively from the second electrode sections 51, 53, 52, toward the front edge of the dielectric plate 1 on which the second electrode sections are formed. As in the other forms of the invention, it is advantageous for the earth terminals drawn out from corresponding first and second electrodes to line up along a common edge of the dielectric plates 1 on which they are formed.

FIFTH EXAMPLE

A fifth example of the present invention is described in the following with reference to FIG. 17. FIG. 17 is an exploded perspective view of a band-pass filter according to the fifth example of the present invention.

In the band-pass filter of the fifth example, loop shaped trimming electrodes 60, 62, 64 are formed between one earth electrode pattern (an upper pattern in FIG. 17) and the protective layer 2. The trimming electrodes 60, 62, 64 are disposed on the opposite side of upper earth electrode pattern from the coil electrode patterns 41, 42, 43 with the dielectric sheet 101 and the earth electrode pattern 5 between them. Connecting terminal patterns 66a, 66b, 66c are formed respectively to the trimming electrodes 60, 62, 64, and are connected to the connecting terminal patterns 66a, 66b, 66c which are drawn out from the coil pattern electrodes 41, 42, 43. The connecting terminal pattern 66a of the trimming electrode 60 is connected to the connecting terminal pattern 66a of the coil electrode pattern 41 via a external connecting electrode 68a. Similarly, the connecting terminal patterns 66b, 66c of the trimming electrodes 62, 64 are connected to the connecting terminal patterns 66b, 66c of the coil electrode patterns 42, 43 via a external connecting electrodes 68b, 68c.

In the band-pass filter of the fifth example, the floating capacitance between the trimming electrodes 60, 62, 64 and the earth electrode pattern 5 is changed by trimming the trimming electrodes 60, 62, 64 as shown by one-dot chain lines in FIG. 17, for example with a laser trimming method. The passing band frequency of the band-pass filter is also changed.

Figure 18:
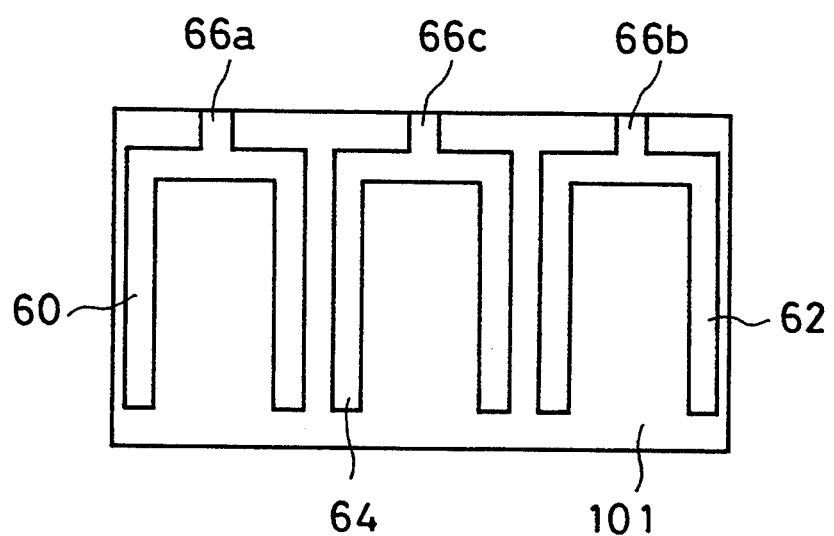
FIG. 18 is a plan view showing a modified example of the band-pass filter of FIG. 17.

The shape of the trimming electrodes 60, 62, 64 is not limited to the loop shape, the shape but rather, may be a part of the loop shape as shown in FIG. 18. In the case of using such shape, the floating capacitance is changed by trimming, and the passing band frequency of the band-pass filter is also changed.

SIXTH EXAMPLE

Figure 19:
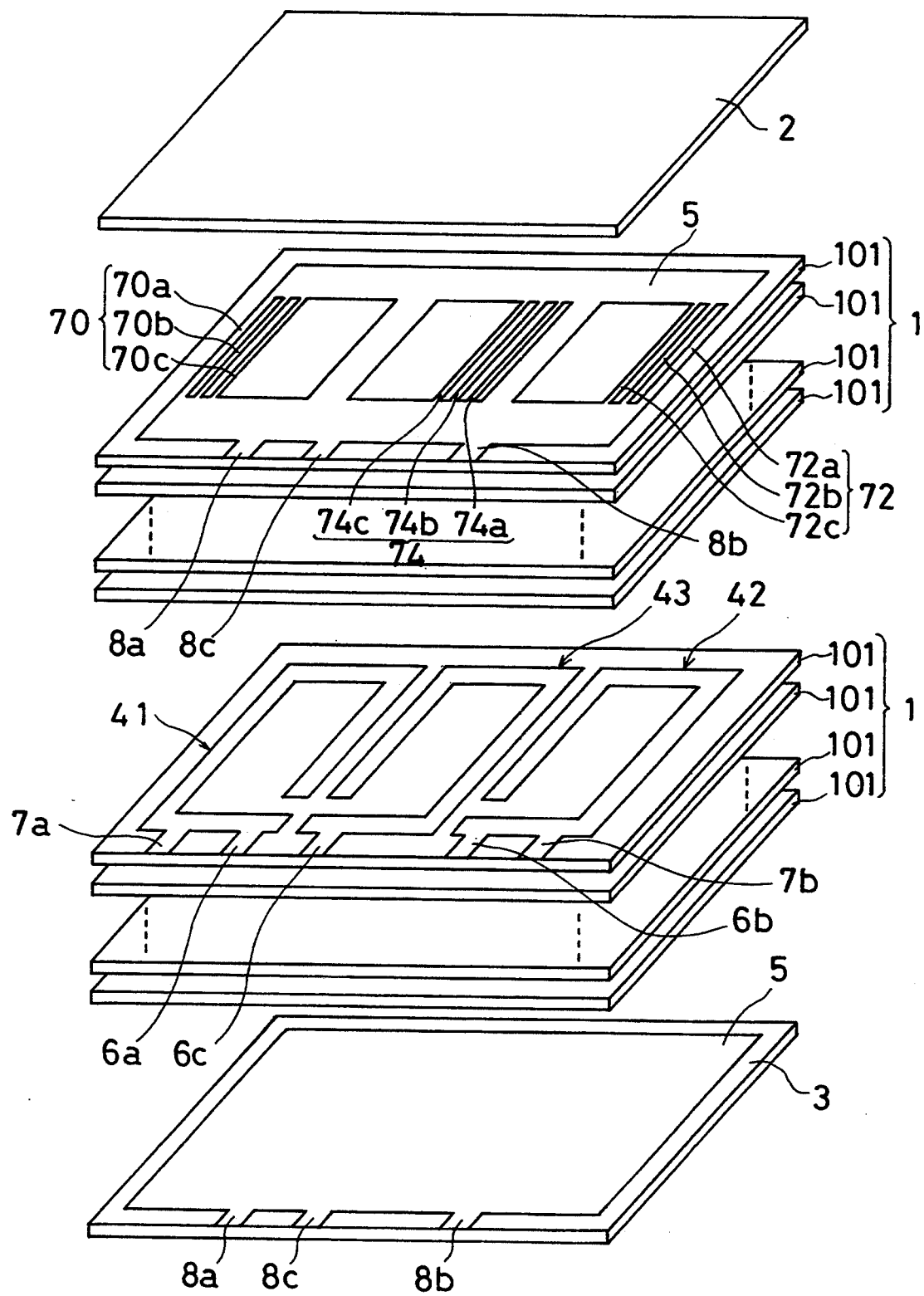
FIG. 19 is an exploded perspective view of a band-pass filter according to a sixth example of the present invention.

A sixth example of the present invention is described in the following with reference to FIG. 19. FIG. 19 is an exploded perspective view of a band-pass filter according to the sixth example of the present invention.

In the band-pass filter of the sixth example, trimming electrode groups 70, 72, 74 are formed in the interior of One earth electrode pattern 5 (an upper pattern in FIG. 19). The trimming electrode group 70 includes band shaped trimming electrodes 70a, 70b, 70c. The trimming electrodes 70a, 70b, 70c are connected to the earth electrode pattern 5. Similarly, the trimming electrode group 72 includes plural trimming electrodes 72a, 72b, 72c, and the trimming electrode group 74 includes plural trimming electrodes 74a, 74b, 74c.

Figure 20:
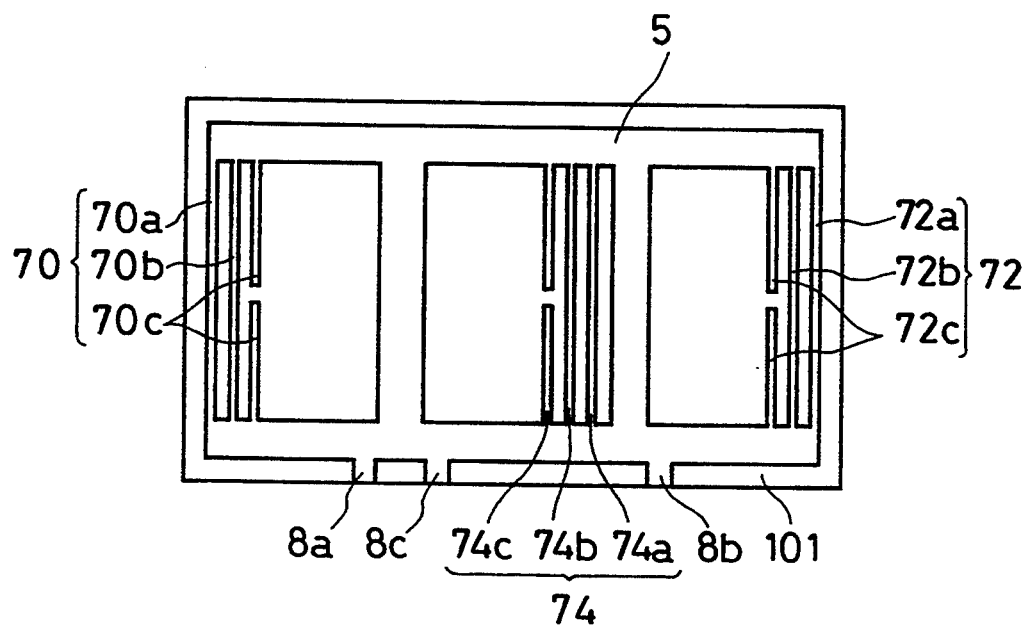
FIG. 20 is a plan view showing a pattern of cutting trimming electrodes of the band-pass filter of FIG. 19.

In the band-pass filter of the sixth example, the shield effect of magnetic field becomes lower by cutting the trimming electrodes as shown in FIG. 20, for example with a laser trimming method. This matter equals to the growth of the magnetic field of each resonator, and the passing band frequency of the band-pass filter is changed. In this case, the changing rate of the passing band frequency can be adjusted by changing the number of the trimming electrodes that are cut.

Figure 21:
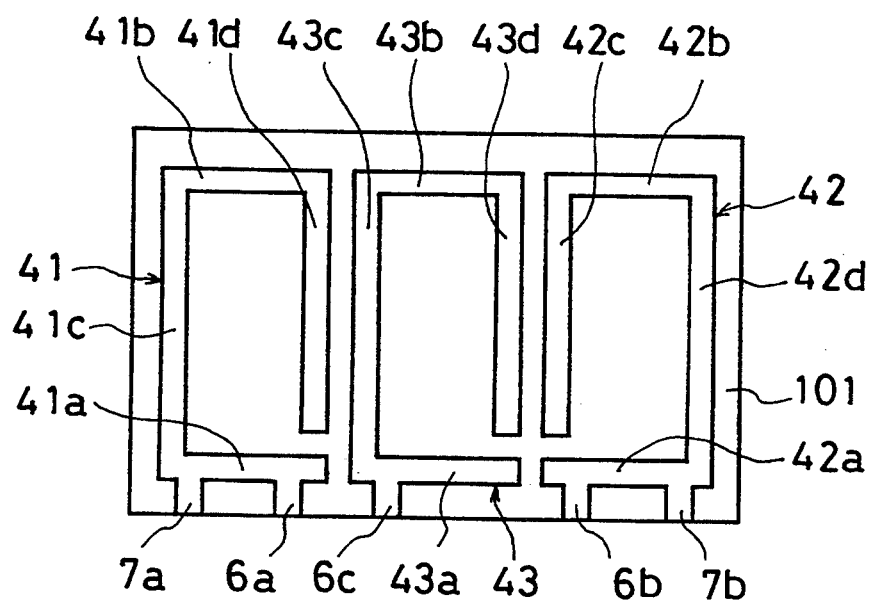
FIG. 21 is a plan view of essential portions showing a modified example of a band-pass filter of the present invention.
Figure 22:
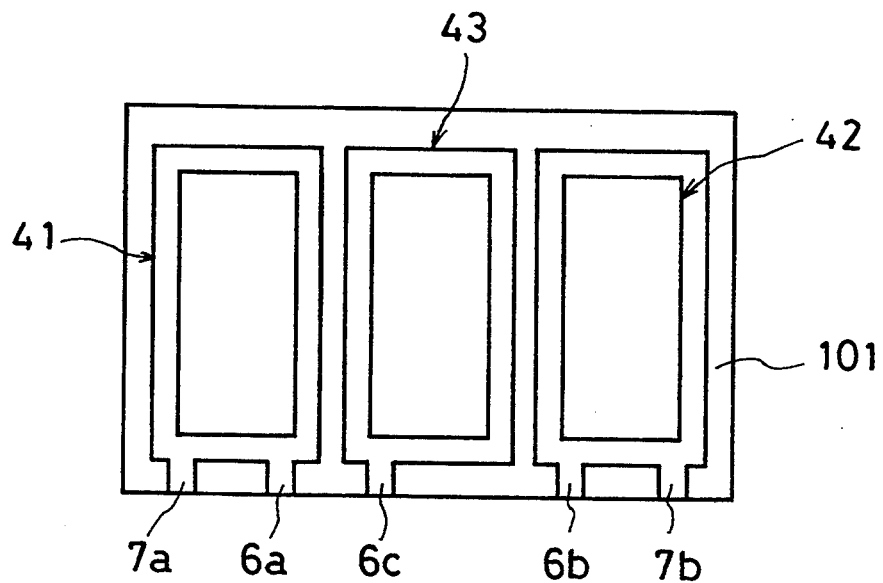
FIG. 22 is a plan view of essential portions showing another modified example of a band-pass filter of the present invention.
Figure 23:
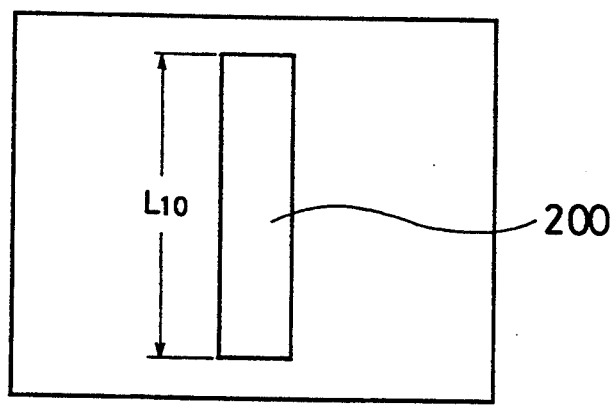
FIG. 23 is an explanatory view showing an example of a conventional strip-line type dielectric resonator.
Figure 24:
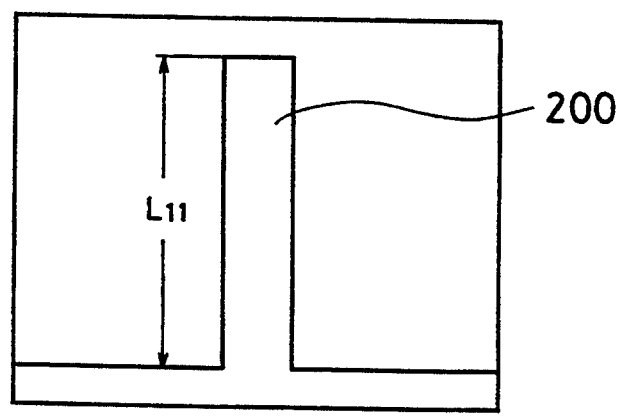
FIG. 24 is an explanatory view showing another example of a conventional strip-line type dielectric resonator.
Figure 25:
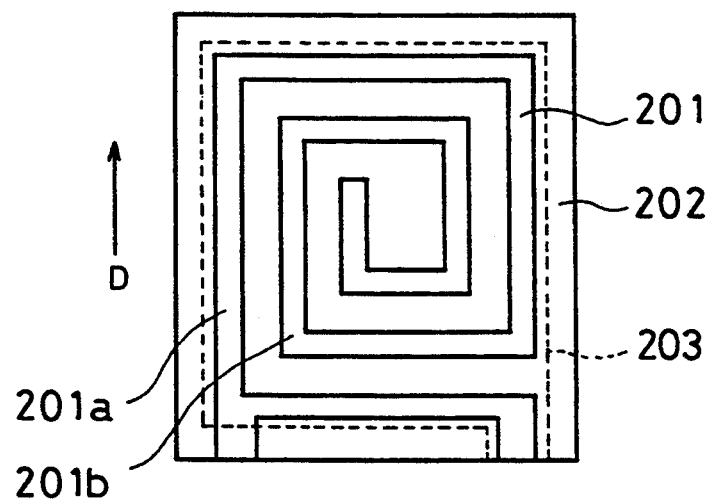
FIG. 25 is an explanatory view showing an example of a conventional coil-pattern type dielectric resonator.

OTHER RESPECTS (1) The construction of the coil electrode patterns 41, 42, 43, it is not limited to those shown in the above-mentioned various examples. For example, it may be a loop shape as shown in FIG. 21 and FIG. 22.

(2) Positions where the input/output terminal pattern and the earth terminal pattern are formed are not limited to the positions shown in the above-mentioned examples. For example, the patterns 6b, 7b of the coil electrode pattern 42 may be drawn out to an end face C (refer to FIG. 2).

(3) The number of coil electrode patterns is not limited to three, it may be four or more. In each case, both input/output terminal patterns and the earth terminal patterns are drawn out from the coil electrode patterns which are positioned at the ends, and only earth terminal patterns are drawn out from the other coil electrode patterns.

As described heretofore, according to the present invention, because it has a so-called strip-line construction and that pattern pieces of the first electrodes are not adjacent to each other, it is possible to improve Q remarkably. As a result, an insertion loss of the band-pass filter is reduced and a skirting characteristic is improved.

Moreover, since the first electrodes are looped, the size of the elements becomes smaller. In addition, it is very easy to adjust the impedance, because it can be adjusted just by changing a distance between the input/output terminal and the earth terminal of the first electrodes.

Additionally, the passing band frequency of the pass-band filter can be adjusted by trimming the trimming electrodes which are formed in the interior of the earth electrode pattern or connected to the coil electrode patterns. The predetermined passing band frequency can be obtained by adjusting the band-pass filter whose passing band frequency is initially shifted from a desired predetermined value. Accordingly, the production of inferior devices can be reduced when the band-pass filter is produced.

In these respects, the invention has an effect of providing a very excellent small-sized band-pass filter whose insertion loss is small and input/output impedances and the passing band frequency can be adjusted optionally.

It will be apparent from the foregoing that, while the present invention has been described in detail and illustrated, these are only particular illustrations and examples and the invention is not limited to those. The spirit and scope of the invention is limited only by the appended claims.

What is claimed is:

1. A band-pass filter comprising:
   at least three first electrodes formed in a loop shape and disposed so as to be magnetically coupled with each other;
   a second electrode formed in a plane shape and opposed to said first electrodes, with a plate comprising a dielectric material being disposed between said first electrodes and said second electrode, said plate having two ends;
   a respective first earth terminal being drawn out from each of said first electrodes toward a selected edge of said plate;
   a pair of input/output terminals being drawn out respectively from a pair of said first electrodes which are disposed toward said first electrodes which are disposed toward said ends of said plate, each said input/output terminal being formed at a distance from the corresponding earth terminal of the respective first electrode so as to provide a predetermined impedance with respect to said earth terminal; and
   at least one second earth terminal being drawn out from said second electrode toward said selected edge of said plate.

2. A band-pass filter comprising:
   at least three first electrodes formed in a loop shape and disposed so as to be magnetically coupled with each other;
   a pair of second electrodes each formed in a plane shape and opposite said first electrodes, a pair of respective plates each defining a plurality of edges including two ends and comprising a dielectric material being disposed between said first electrodes and each of said second electrodes;
   a respective first earth terminal being drawn out from each of said first electrodes toward a selected edge defined by said plates;
   a pair of input/output terminals being drawn out from each of said first electrodes toward a selected edge defined by said plates;
   a pair of input/output terminals being drawn out respectively from a pair of said first electrodes which are disposed toward said ends of said plates, each said input/output terminal being formed at a distance from the corresponding earth terminal of the respective first electrode so as to provide a predetermined impedance with respect to said earth terminal; and
   at least one second earth terminal being drawn out respectively from each of said second electrodes toward said selected edge defined by said plates.

3. A band-pass filter according to claim 2, wherein at least one of said pair of second electrodes is divided into three or more sections which have a similar shape which is larger than that of said first electrodes, and respective said second earth terminals are drawn out respectively from the sections of the second electrode toward said selected edge of said plates.

4. A band-pass filter according to claim 2, wherein between said first electrodes and at least one of said pair of second electrodes, third electrodes are formed, each having a similar shape to that of a respective one of said first electrodes.

5. A band-pass filter according to claim 3, wherein between said first electrodes and at least one of said pair of second electrodes, third electrodes are formed, each having a similar shape to that of a respective one of said first electrodes.

6. A band-pass filter according to claim 2, further comprising trimming electrodes having a loop shape which are spaced a distance from one of said second electrodes opposite said one of said second electrodes by an additional plate comprising a dielectric material, said additional plate being disposed between said trimming electrodes and said one of said second electrodes, said trimming electrodes being connected to said first electrodes.

7. A band-pass filter according to claim 2, wherein a plurality of trimming electrodes are formed in a strip shape within at least one of said second electrodes and connected to said one of said second electrodes.

8. A band-pass filter according to claim 6, wherein said trimming electrodes each form a closed loop shape.

9. A band-pass filter according to claim 6, wherein said trimming electrodes each form an interrupted loop shape.

10. A band-pass filter comprising:
    at least three first electrodes formed in a loop shape and disposed so as to be magnetically coupled with each other;
    a second electrode formed in a plane shape and opposed to said first electrodes, with a plate comprising a dielectric material being disposed between said first electrodes and said second electrode, said plate having two ends and a periphery;
    a respective first earth terminal being drawn out from each of said first electrodes toward said periphery of said plate;
    a pair of input/output terminals being drawn out toward said periphery from a pair of said first electrodes, said pair of first electrodes being disposed toward said ends of said plate;
    each said input/output terminal being formed at a distance around said periphery from the corresponding earth terminal of the respective first electrode so as to provide a predetermined impedance with respect to said earth terminal; and
    at least one second earth terminal being drawn out from said second electrode toward said periphery of said plate.

11. A band-pass filter comprising:
    at least three first electrodes formed in a loop shape and disposed so as to be magnetically coupled with each other;
    a pair of second electrodes each formed in a plane shape and opposite said first electrodes, a pair of respective plates each defining a periphery which includes two ends and comprising a dielectric material being disposed between said first electrodes and each of said second electrodes;
    a respective first earth terminal being drawn out from each of said first electrodes toward said periphery defined by said plates;

a pair of input/output terminals being drawn out toward said periphery from a pair of said first electrodes which are disposed toward said ends of said plates;

each said take-out terminal being formed at a distance around said periphery from the corresponding earth terminal of the respective first electrode so as to provide a predetermined impedance with respect to said earth terminal; and at least one second earth terminal being drawn out respectively from each of said second electrodes toward said periphery defined by said plates.

* * * * *

UNITED STATES PATENT AND TRADEMARK OFFICE
CERTIFICATE OF CORRECTION

PATENT NO. : 5,351,020
DATED      : September 27, 1994
INVENTOR(S): Okamura et al.

It is certified that error appears in the above-indentified patent and that said Letters Patent is hereby corrected as shown below:

On the title page:

Item [73]    change

[73]  Assignee:  Myrata Manufacturing Co., Ltd., Japan to

[73]  Assignee:  Murata Manufacturing Co., Ltd., Japan

Signed and Sealed this

Fourteenth Day of March, 1995

Attest:

BRUCE LEHMAN

*Attesting Officer*    *Commissioner of Patents and Trademarks*